(12) United States Patent
de Ambroggi et al.

(10) Patent No.: US 7,187,589 B2
(45) Date of Patent: Mar. 6, 2007

(54) NON-VOLATILE SEMICONDUCTOR MEMORY AND METHOD FOR WRITING DATA INTO A NON-VOLATILE SEMICONDUCTOR MEMORY

(75) Inventors: Luca de Ambroggi, Dresden (DE); Francesco Maria Brani, Milan (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 113 days.

(21) Appl. No.: 11/127,022

(22) Filed: May 11, 2005

(65) Prior Publication Data
US 2006/0256621 A1   Nov. 16, 2006

(51) Int. Cl.
*G11C 16/04* (2006.01)
(52) U.S. Cl. .................... 365/185.28; 365/185.18; 365/185.03
(58) Field of Classification Search ........... 365/185.28, 365/185.18, 185.03
See application file for complete search history.

(56) References Cited

U.S. PATENT DOCUMENTS 6,490,204 B2 * 12/2002 Bloom et al. .......... 365/185.28
6,829,173 B2   12/2004 Ooishi

* cited by examiner

*Primary Examiner*—Huan Hoang
(74) *Attorney, Agent, or Firm*—Slater & Matsil, L.L.P.

(57) ABSTRACT

Data is written into a non-volatile semiconductor memory using one of at least four steps. A first step is executed if the final states of both the first bit (B1) and the second bit (B2) coincide with their respective initial states and includes maintaining the initial states of the first bit (B1) and the second bit (B2). A second step is executed if both the first bit (B1) and the second bit (B2) have erased final states and the initial states of both the first bit (B1) and the second bit (B2) were not erased and includes erasing both the first bit (B1) and the second bit (B2). A third step is executed if neither the first bit (B1) nor the second bit (B2) is to be changed from a programmed initial state to an erased final state and includes programming the first bit (B1) if the first bit (B1) is to be changed from an erased initial state to a programmed final state, and/or programming the second bit (B2) if the second bit (B2) is to be changed from an erased initial state to a programmed final state. A fourth step is executed if only one of the first bit (B1) and the second bit (B2) is to be changed from a programmed initial state to an erased final state and includes first erasing both the first bit (B1) and the second bit (B2) and then programming the first bit (B1) if the first bit (B1) is programmed in the final state or programming the second bit (B2) if the second bit (B2) is programmed in the final state.

20 Claims, 7 Drawing Sheets

| IS \ FS | (0,0) | (0,1) | (1,0) | (1,1) |
|---|---|---|---|---|
| (0,0) | E, P-P | E, P-/ | E, /-P | E, /-/ |
| (0,1) | E, P-P | E, P-/ | E, /-P | E, /-/ |
| (1,0) | E, P-P | E, P-/ | E, /-P | E, /-/ |
| (1,1) | E, P-P | E, P-/ | E, /-P | E, /-/ |

| IS \ FS | (0,0) | (0,1) | (1,0) | (1,1) |
|---|---|---|---|---|
| (0,0) | /, /-/ | E, P-/ | E, /-P | E, /-/ |
| (0,1) | /, /-P | /, /-/ | E, /-P | E, /-/ |
| (1,0) | /, P-/ | E, P-/ | /, /-/ | E, /-/ |
| (1,1) | /, P-P | /, P-/ | /, /-P | /, /-/ |

NON-VOLATILE SEMICONDUCTOR MEMORY AND METHOD FOR WRITING DATA INTO A NON-VOLATILE SEMICONDUCTOR MEMORY

TECHNICAL FIELD

The present invention relates to non-volatile semiconductor memories and to methods for writing data into such memories.

BACKGROUND

Flash memories are high-density non-volatile memories and may be divided into data flash and code flash memories. Data flash memories are typically used for storing large data volumes and possess a large number of memory cells in each sector. Code flash memories are typically used for storing program code and require smaller portions of memory to be accessible for read, write, and erase operations. The storage capacity of flash memories can be increased by increasing the number of bits stored per cell.

Nitride programmable read-only memory (NROM) cells can store two bits per cell. FIG. 1 shows a sectional view through an NROM cell as known in the prior art. The gate G of the cell will be connected to a wordline and the two source/drain regions S/D will be connected to bitlines. Below the gate G is the so-called ONO layer which consists of a top oxide layer TO, a bottom oxide layer BO, and a nitride layer NL sandwiched between the top oxide layer TO and the bottom oxide layer BO. Electric charge can be stored in the nitride layer NL at a first location that is close to a first source/drain region S/D and at a second location that is close to the second source/drain region S/D. The channel of the NROM cell is formed between the first source/drain region S/D and the second source/drain region S/D and lies below the ONO layer in the semiconductor substrate SB.

The amount of charge stored in each location can be adjusted independently from the charge stored in the other location, so that it is possible to store a first bit B1 and a second bit B2 in a single cell. For each location, the amount of electrical charge stored determines the threshold voltage value VTH of this part of the cell. A high threshold value VTH corresponds to a programmed state and a low threshold value VTH corresponds to an erased state.

Reading the first bit B1 involves applying a gate voltage that is between the high and low threshold voltages and sensing the current flowing through the cell while applying potentials of, for example, 0 V to the first source/drain region S/D and 1.5 V to the second source/drain region S/D.

Programming the first bit B1 involves applying voltages of, for example, 4.5 V to the first source/drain S/D which is close to the first bit B1, 0 V to the second source/drain S/D, and 9 V to the gate G so that hot electrons will tunnel from the channel of the cell into the nitride layer NL.

Erasing the first bit B1 involves hot hole injection by applying, for example, a voltage of 8 V to the first source/drain S/D close to the first bit B1, floating the other source/drain S/D, and a negative voltage to the gate G.

For reading, programming and erasing the second bit B2 the voltages applied to the first and second source/drain region S/D are swapped.

For the purpose of this invention, the symbol shown in FIG. 2 is used to represent a NROM cell with a gate contact G, two source/drain contacts S/D and indicating that a first bit B1 and a second bit B2 can be stored in the cell. The source/drain contact S/D close to the first bit B1 will be called first source/drain contact while the source/drain contact S/D close to the second bit B2 will be called second source/drain contact. The same reference sign S/D is used for both the first source/drain contact and the second source/drain contact in order to indicate that the cell is symmetrical with respect to those contacts.

In order to minimize the layout area, NROM cells are frequently connected using a so-called "virtual ground array", as illustrated in FIG. 3. A group of memory cells MC are arranged along rows and columns and connected to wordlines WL and bitlines BL. The gate contacts G of the memory cells MC arranged along rows are connected by wordlines WL. The source/drain contacts S/D of the memory cells MC arranged along columns are connected to bitlines BL, with each bitline BL being shared between two memory cells MC adjacent along rows. By sharing the bitlines BL between two cells instead of having two bitlines for each cell, the area required for the memory M can be reduced. Each first bit B1 and second bit B2 in the memory cells MC in the array M can be addressed by means of the wordline WL and the bitlines BL corresponding to the row and the column in which the memory cell MC is located.

Each time the content of memory cells MC in standard flash memories is to be altered, a block erase or sector erase followed by a programming of the sector is performed in case that the memory cells MC that are to be programmed are not already erased. This approach is a leftover from the first flash memory generation, the ETOX or floating gate flash memory, in which the memory cells shared a common substrate and source. As a consequence, whenever an erase voltage is applied to the source and/or substrate, the erase pulse is applied in parallel to all cells that share the same substrate and source terminals.

While providing compatibility, this erase and programming mechanism also has significant disadvantages for modem flash memories. As an erase operation is performed every time that the content of any of the memory cells is to be changed, the power consumption of the memory is high. Further, all cells are subjected to the erase and program cycle even if their contents need not be changed. This unnecessary cycling reduces the lifetime of the memory cell and the reliability of the memory as a whole. Further, the data throughput is reduced as at least an erase operation is performed every time data is written to the memory.

SUMMARY OF THE INVENTION

Accordingly, in one aspect, the invention provides a non-volatile semiconductor memory with improved memory performance in terms of a higher data throughput, reduced power consumption, and improved reliability.

Embodiments of the invention provide a method for writing data into a non-volatile semiconductor memory. The semiconductor memory includes a plurality of memory cells, a plurality of bitlines and a plurality of wordlines. Each memory cell has a gate contact, a first source/drain contact and a second source/drain contact, and provides storage for a first bit and a second bit. In each of the first bit and the second bit, a programmed or an erased state can be stored. The plurality of memory cells are organized in rows along a first direction and in columns along a second direction. In each row, the gate contacts of the memory cells are coupled to a respective same wordline of the plurality of wordlines. In each row, each memory cell is coupled to a neighboring memory cell via a respective one of its source/drain contacts. In each column, the source/drain contacts of each memory cell are coupled to a respective same bitline of the plurality of bitlines. First memory cells and second memory cells are memory cells that are adjacent to each other along rows, wherein the initial states stored in the first bit of a second memory cell and in the second bit of a corresponding first memory cell are changed to final states by executing one step in the group of steps a), b), c) and d). Step a) is executed if the final states of both the first bit and the second bit coincide with their respective initial states and comprises maintaining the initial states of the first bit and the second bit. Step b) is executed if both the first bit and the second bit have erased final states and the initial states of both the first bit and the second bit were not erased and comprises erasing both the first bit and the second bit. Step c) is executed if neither the first bit nor the second bit is to be changed from a programmed initial state to an erased final state and comprises programming the first bit if the first bit is to be changed from an erased initial state to a programmed final state, and programming the second bit if the second bit is to be changed from an erased initial state to a programmed final state. Finally, step d) is executed if only one of the first bit or the second bit is to be changed from a programmed initial state to an erased final state and comprises first erasing both the first bit and the second bit and then programming the first bit if the first bit is programmed in the final state or programming the second bit if the second bit is programmed in the final state.

Instead of having to erase a whole sector of memory cells in order to program the memory cells, this method of writing data into the memory has the advantage that one can address and write data into a portion of the memory that is as small as two bits. Furthermore, if the contents of the memory cells need not be changed, the cells are neither subjected to erase nor programming operations. In case an erase operation is not needed to reach the final state, the cells can be directly programmed without first being subjected to an erase operation. Furthermore, programming operations are performed only on bits that are to be changed, while in the prior art all bits that where erased together with the bits that are to be changed have to be reprogrammed if their initial state was programmed.

Preferably, in steps b) and d), the first bit of the second memory cell and the second bit of the first memory cell are erased selectively with respect to all the other bits stored in the semiconductor memory.

Preferably, selectively erasing both the first bit and the second bit in steps b) and d) includes: applying a wordline potential to the wordline that connects the gate contact of the first memory cell and the gate contact of the second memory cell; applying a second bitline potential that is higher than the wordline potential to the bitline that couples the second source/drain contact of the first memory cell and the first source/drain contact of the second memory cell; and letting the potential of the bitline that connects the first source/drain contact of the first memory cell and the potential of the bitline that connects the second source/drain contact of the second memory cell float.

The wordline potential is usually negative while the second bitline potential is usually positive.

Preferably, erasing both the first bit and the second bit in steps b) and d) includes testing if both the first bit and the second bit are erased, and repeating the step of erasing until both the first bit and the second bit are erased. In this way, it can be verified that the bits really store an erased state.

Preferably, programming the first bit and the second bit in steps c) and d), respectively, includes: applying a wordline potential to the wordline that couples the gate contact of the first memory cell and the gate contact of the second memory cell, applying a second bitline potential that is lower than the wordline potential to the bitline that couples the second source/drain contact of the first memory cell and the first source/drain contact of the second memory cell; applying a third bitline potential that is lower than the second bitline potential to the bitline that couples the second source/drain contact of the second memory cell and letting the potential of the bitline that couples the first source/drain contact of the first memory cell float, if the first bit in the second memory cell is to be programmed in the final state, and applying a first bitline potential that is lower than the second bitline potential to the bitline that couples to the first source/drain contact of the first memory cell and letting the potential of the bitline that couples the second source/drain contact of the second memory cell float, if the second bit of the first memory cell is to be programmed in the final state.

Usually, the wordline potential and the second bitline potential are positive, while the first and third bitline potentials are ground potentials.

Preferably, programming the first bit and the second bit, respectively, in steps c) and d) includes: testing after programming if the desired programmed final state is stored in the first bit and the second bit, respectively, and if the desired programmed final state is not stored in the first bit and the second bit, respectively, repeating programming each of the first bit and the second bit until the desired final programmed state is stored in the first bit and the second bit, respectively. In this way, it can be verified that the bits really store programmed states.

Preferably, in step d) the initial states of the first bit and the second bit are stored before the step of erasing the first bit and the second bit and the stored values are used for programming either one of the first bit or the second bit to the respective initial value. In this way the initial value is not lost when both bits are erased together.

Preferably, the number of bits to be written into the semiconductor memory is determined before executing any of the steps a) to d). This allows to determine if it is more effective in terms of time to erase a whole sector of cells or to selectively erase first and second bits.

Preferably, memory cells are grouped into sectors, each sector containing a predetermined number of memory cells, wherein writing data into the memory cells of a sector comprises erasing all memory cells in that sector and then programming the required memory cells if the number of bits of data to be written into the semiconductor memory exceeds a predetermined fraction of the predetermined number of memory cells in a sector, and omitting the execution of steps a) to d). The predetermined portion may depend on parameters such as current consumption, required data throughput and sector size.

Preferably, the memory cells are nitride programmable read only memory cells. These cells have the advantage of being able to store two bits per cell while requiring very little space when arranged in a virtual ground array. At the same time, such memory cells can be produced with standard processes.

Further provided is a method for writing data into a non-volatile semiconductor memory. The semiconductor memory can include a plurality of memory cells, each memory cell providing storage for a first bit and a second bit. Each of the first bit and the second bit are able to store a programmed or erased state. First memory cells and corresponding second memory cells of the plurality of memory cells are coupled by a same bitline and a same wordline. The initial states stored in the first bit of a second memory cell and in the second bit of a corresponding first memory cell are changed to final states by executing one step in the group of steps a), b), c) and d). Step a) is executed if the final states of both the first bit and the second bit coincide with their respective initial states and includes maintaining the initial states of the first bit and the second bit. Step b) is executed if both the first bit and the second bit have erased final states and the initial states of both the first bit and the second bit were not erased and includes erasing both the first bit and the second bit. Step c) is executed if neither the first bit nor the second bit is to be changed from a programmed initial state to an erased final state and includes programming the first bit if the first bit is to be changed from an erased initial state to a programmed final state, and/or programming the second bit if the second bit is to be changed from an erased initial state to a programmed final state. Step d) is executed if only one of the first bit and the second bit is to be changed from a programmed initial state to an erased final state and includes first erasing both the first bit and the second bit and then programming the first bit if the first bit is programmed in the final state or programming the second bit if the second bit is programmed in the final state.

Using this method memory cells are only programmed when needed and only erased when needed, thus saving power and increasing the data throughput while at the same time subjecting the cells to less cycles, which results in improved reliability and endurance.

There is further provided a non-volatile semiconductor memory, that includes a plurality of memory cells grouped in sectors and coupled to a plurality of wordlines and a plurality of bitlines. A wordline decoder and a bitline decoder are coupled to an address unit. Each memory cell stores a first bit and a second bit. The wordlines and bitlines couple the memory cells to form a virtual ground array. A control unit controls the address unit to switch between: addressing whole sectors of memory cells and addressing the first bits of second memory cells and the second bits of first memory cells, wherein the first memory cells and the second memory cells are coupled by a same wordline and a same bitline.

This aspect of the invention can provide a semiconductor memory that represents a combination of the conventional method of writing data into a flash memory and the new method of selectively addressing two bits in two different memory cells. The ability to switch between the two methods is of high relevance especially for data flash memories in which large sectors are erased and reprogrammed even if only one or two bits need to be changed.

Preferably, the control unit switches between addressing whole sectors and addressing first bits and second bits depending on the number of bits of data to be written into the memory. The amount of bits to be written determines which method is more suitable for writing data into the memory.

Preferably, the control unit switches between addressing whole sectors and addressing first bits and second bits depending on the command used for writing data into the memory. The command usually contains the amount of data or an address area into which the data is to be written and thus provides the information necessary for deciding which method is used for writing data into memory.

Preferably, the memory cells are nitride programmable read only memory cells.

BRIEF DESCRIPTION OF THE DRAWINGS

The invention will now be described in more detail below by way of non-limiting examples and with reference to the accompanying drawings, in which.

The following list of reference symbols can be used in conjunction with the figures:

| | |
|---|---|
| A | Address unit |
| AD | Address |
| A1 to A7 | Actions |
| B1 | First bit |
| B2 | Second bit |
| BL | Bit line |
| BL1 | First bitline |
| BL2 | Second bitline |
| BL3 | Third bitline |
| BLD | Bit line decoder |
| BO | Bottom oxide |
| C | Command |
| CU | Control unit |
| DA | Data |
| DB | Double bit |
| FS | Final state |
| G | Gate |
| IS | Initial state |
| M | Memory array |
| MC | Memory cell |
| MC1 | First memory cell |
| MC2 | Second memory cell |
| NL | Nitrate layer |
| ONO | Oxide-Nitride-Oxide layer |
| Q0 to Q5 | Queries |
| R | Register |
| S/D | Source/Drain |
| SB | Semiconductor substrate |
| SC | Sector |
| S0 to S5 | States |
| TO | Top oxide |
| VWL | Word line potential |
| VBL1 | Potential of first bitline |
| VBL2 | Potential of second bitline |
| VBL3 | Potential of third bitline |
| WL | Word line |
| WLD | Word line decoder |
| X | First direction |
| Y | Second direction |

DETAILED DESCRIPTION OF ILLUSTRATIVE EMBODIMENTS

Figure 1:
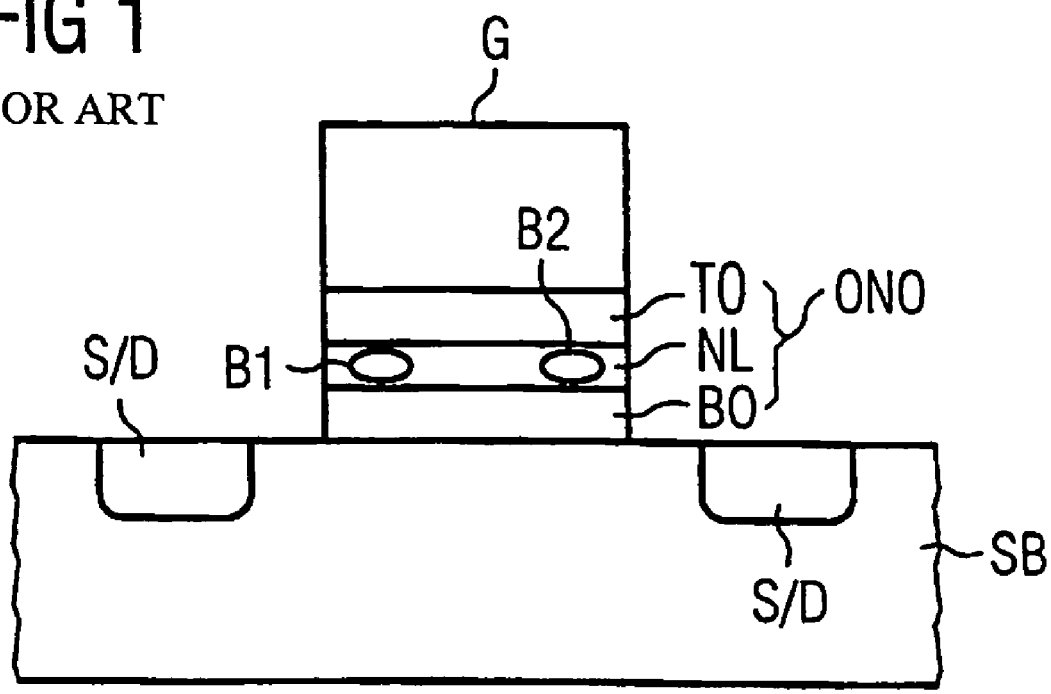
FIG. 1 shows a section through an NROM cell.
Figure 2:
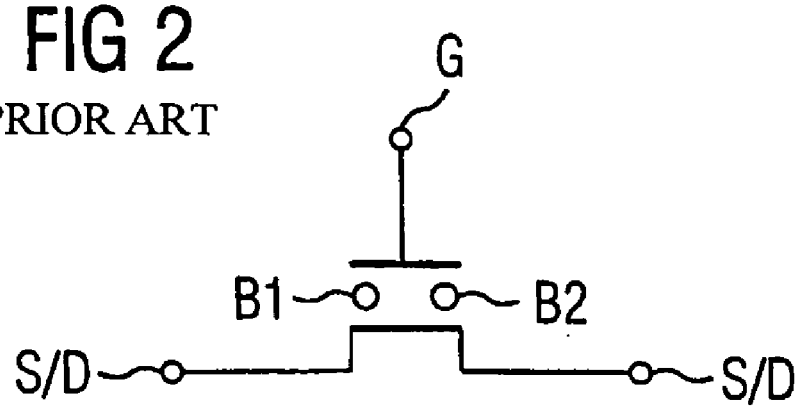
FIG. 2 shows an electrical symbol of an NROM cell.
Figure 3:
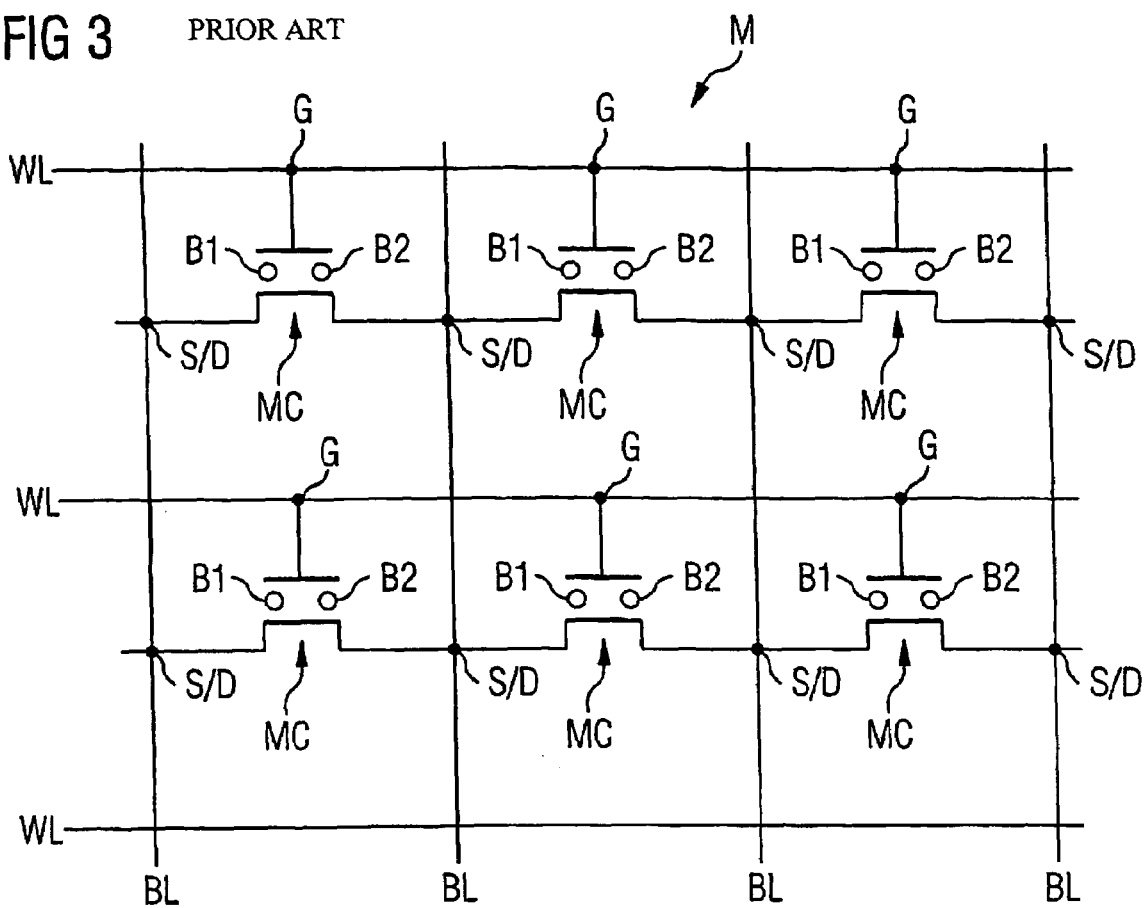
FIG. 3 shows a virtual ground array.
Figure 4:
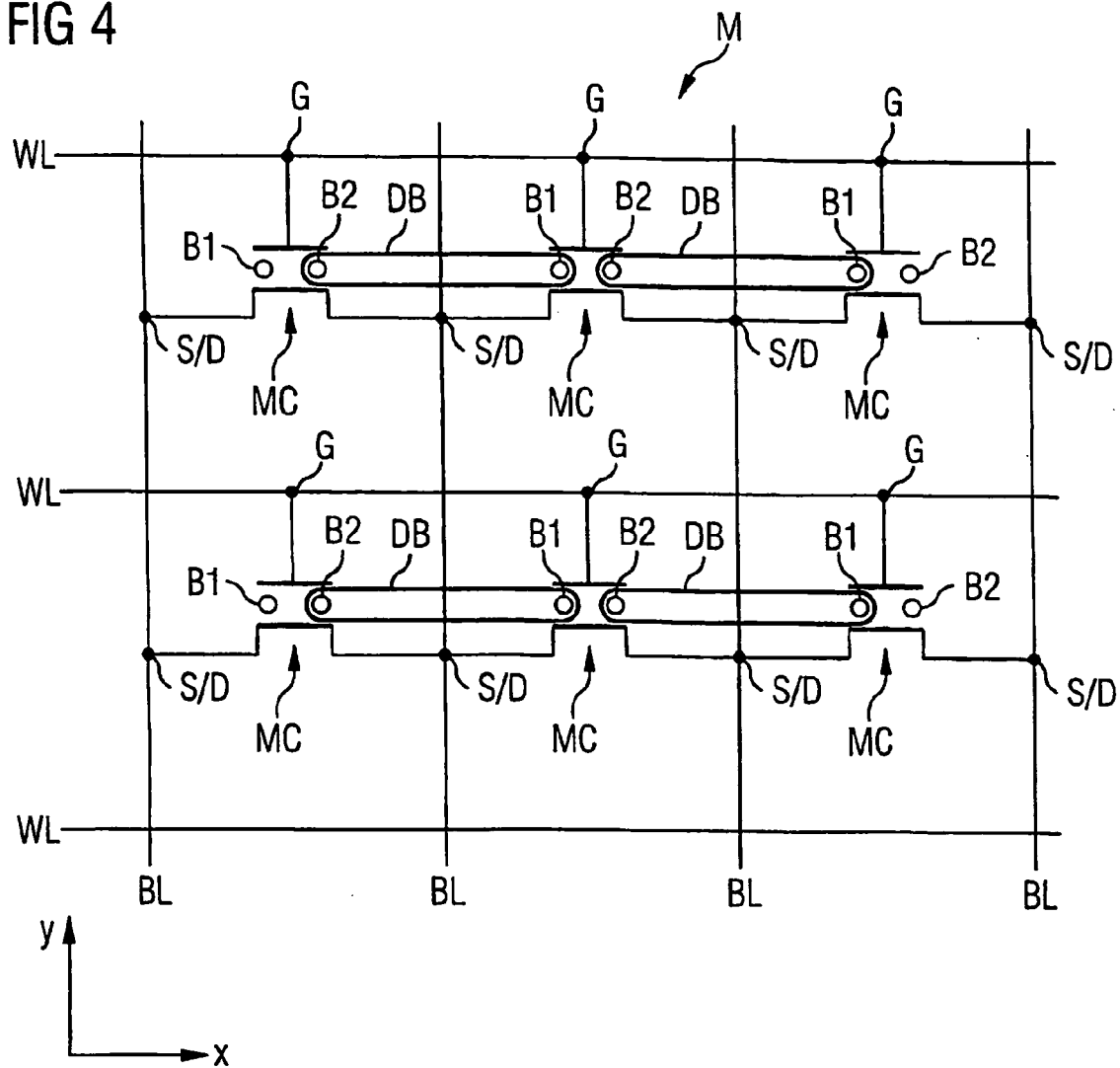
FIG. 4 illustrates double bits inside a virtual ground array.

Reference is now made to FIG. 4, which shows part of the circuitry of a virtual ground array. Memory cells MC are organized in rows and columns along a first direction X and a second direction Y, respectively. The gate contacts G of memory cells MC arranged in rows are coupled by wordlines WL. Bitlines BL couple the source/drain contacts S/D of memory cells MC arranged in columns. Neighboring cells MC in rows share a bitline BL. Each memory cell MC can store a first bit B1 and a second bit B2. The second bit B2 of memory cells MC and the first bit B1 of neighboring memory cells MC along the X direction form so-called "double bits" DB. Double bits DB are formed by memory cells MC that share a bitline BL and a wordline WL.

Figure 5:
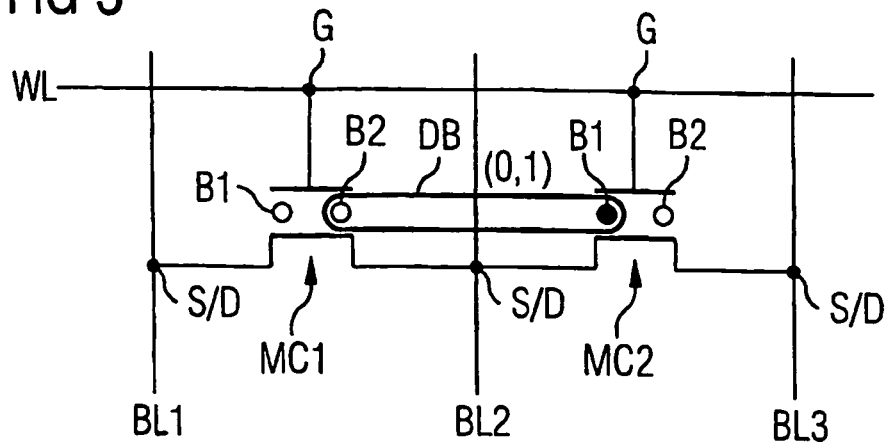
FIG. 5 illustrates the concept of the double bit.

The concept of the double bit DB is further illustrated in FIG. 5 which shows two neighboring cells, namely, a first memory cell MC1 and a second memory cell MC2. The gate contacts G of the first memory cell MC1 and the second memory cell MC2 are coupled by the wordline WL. The first source/drain contact S/D of the first memory cell MC1 is coupled by the bitline BL1 while the second source/drain contact S/D of the second memory cell MC2 is coupled by the bitline BL3. The second source/drain S/D of the first memory cell MC1 and the first source/drain contact S/D of the second memory cell MC2 are both coupled by the bitline BL2.

Circles are used for representing the first bit B1 and the second bit B2. An empty circle represents the value "0", a filled-in circle is used for the value "1". For the purpose of illustration, the value "0" is stored in the second bit B2 of the first memory cell MC1 and the value "1" is stored in the first bit B1 of the second memory cell MC2. As a notation for the values stored in the double bit DB "(m, n)" is used with "m" representing the value stored in the second bit B2 of the first memory cell MC1 and "n" representing the value stored in the first bit B1 of the second memory cell MC2. The value "1" represents an erased state while the value "0" represents a programmed state of the bit.

Figure 6:
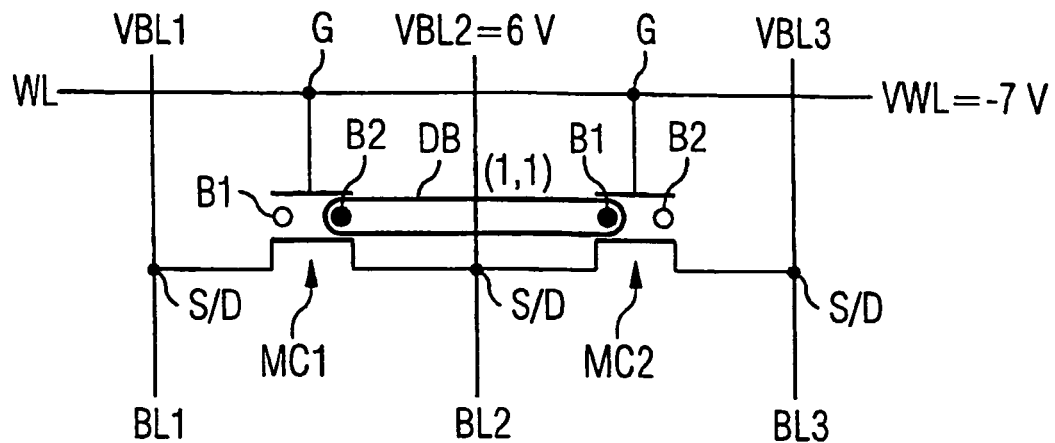
FIG. 6 shows the erasing of a double bit.
Figure 7:
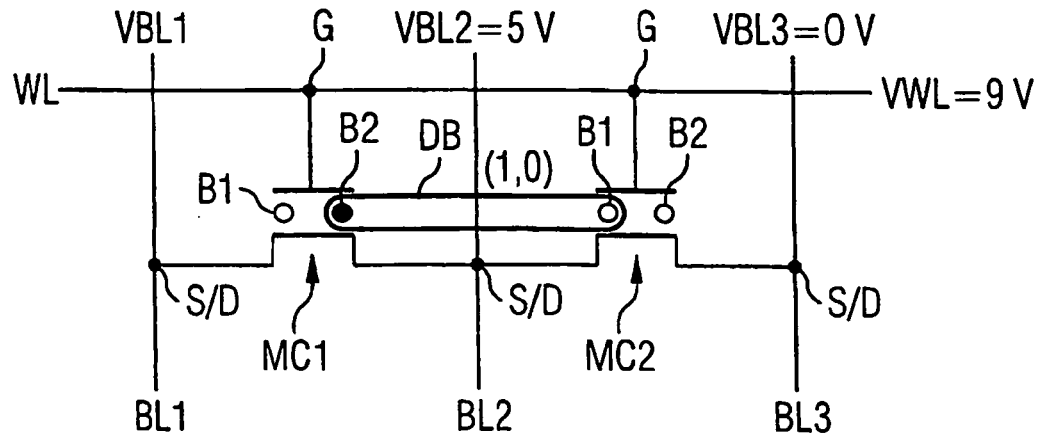
FIG. 7 shows the programming of a bit of the double bit.

For the purpose of illustration, the steps involved in programming the double bit DB from an initial state (0, 1) to a final state (1, 0) are shown in FIGS. 5, 6, and 7. Transitions from one state to another state can be indicated by an arrow "→", so that the above transition is represented by: (0, 1)→(1, 0).

The bits in a double bit DB can be programmed individually. However, they can only be erased together. This is a consequence of the shared wordline WL and the shared second bitline BL2, which cause the second bit B2 of the first memory cell MC1 and the first bit B1 of the second memory cell MC2 to be always erased at the same time. As a result an intermediate step in which the double bit DB has the value (1, 1) and in which both the first bit B1 and the second bit B2 of the double bit DB are erased is necessary for reaching some of the desired final states.

FIG. 6 illustrates this intermediate step. Both the first bit B1 of the second memory cell MC2 and the second bit BL2 of the first memory cell MC1 are shown as filled-in circles, indicating that an erased state is stored in both. To erase the double bit DB, a negative voltage VWL is applied to the wordline WL. At the same time, a positive voltage VBL2 is applied to the second bitline BL2 while the potential VBL1 and VBL3 of the first bitline BL1 and the third bitline BL3 are left floating. The applied voltages can, for example, be chosen to be VWL=−7 V and VBL2=6 V. As a result of the applied voltages, hot holes are injected into the ONO layer, where they neutralize the locally stored electrons, so that the effective charge is reduced.

FIG. 7 shows the programming step required to obtain the double bit DB (1, 0). The first bit B1 of the second memory cell MC2 is programmed while the second bit B2 of the first memory cell MC1 is to be kept in the erased state. This programming of the first bit B1 can be achieved by applying a positive voltage VWL to the wordline WL to which the gate contacts G of the memory cells MC1 and MC2 are coupled. At the same time, a lower positive voltage VBL2 has to be applied to the second bitline BL2 while an even lower voltage VBL3 is applied to a third bitline BL3. The potential VBL1 of the first bitline BL1 is left floating. As an example, the applied voltages can be chosen to be VWL=9 V, VBL2=5 V, and VBL3=0 V. In case that the second bit B2 of the first memory cell MC1 is to be programmed, the potentials VBL1 and VBL3 on the first bitline BL1 and the third bitline BL3 can be swapped.

Figure 8:
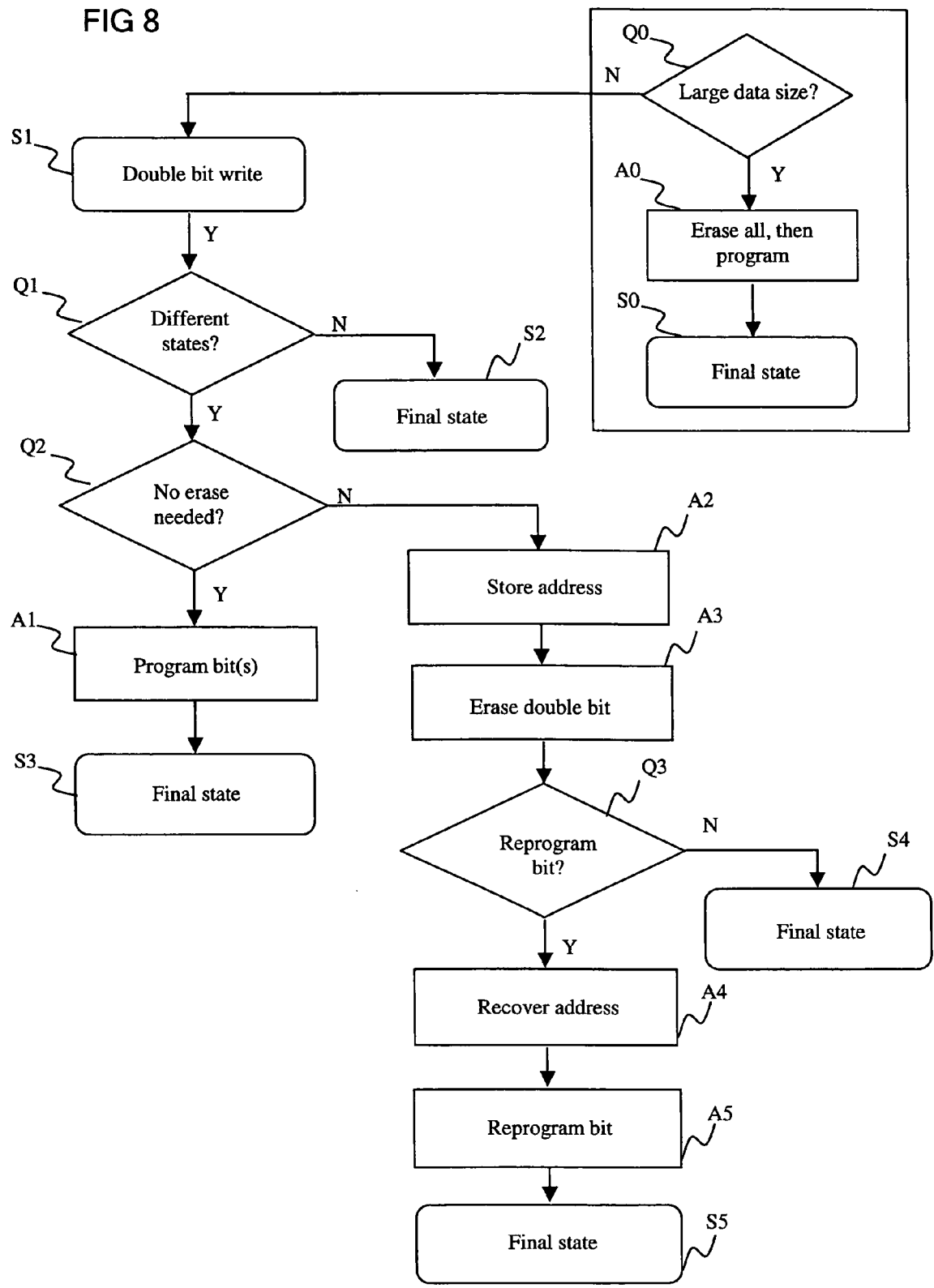
FIG. 8 shows a flow chart of the method used for programming the memory.

FIG. 8 shows a flow chart of a method according to the invention used for writing data into the memory. The ovals S0, S1, . . . , S5 represent states, the diamonds Q0, Q1, . . . , Q3 represent queries, and the rectangles A0, A1, . . . , A5 represent actions.

The first query Q0 determines if data volumes large compared to the size of a sector are to be written into the memory. If this is the case, action A0, a method known from the state-of-the-art is used for writing the data into the memory. After the completion of action A0, the final state S0 is reached. In case only a small number of bits have to be written, the flow is passed on to state S1, which represents the first step in writing data into the memory using double bit granularity.

Next, the query Q1 determines if the desired final state of the bits in the double bit DB are different from the initial states in the double bit DB. If the final and the initial state are the same, the flow can exit at state S2 without erasing or programming any of the bits of the double bit DB. The transitions for which this is true are (0, 0)→(0, 0), (0, 1)→(0, 1), (1, 0)→(1, 0), and (1, 1)→(1, 1). If the initial state differs from the final state, the flow moves on to query Q2.

In query Q2, it is determined if only programming of one or more of the bits in a double bit is needed. In other words, no erase is needed as none of the bits of the double bit are to be changed from a programmed to an erased state. If only programming is needed, the flow moves on to action A1 in which the required bit or bits of the double bit are programmed. This is the case for the transitions (0, 1)→(0, 0), (1, 0)→(0, 0), (1, 1)→(0, 0), (1, 1)→(0, 1), and (1, 1)→(1, 0). In these cases, all transitions are from a "1" to "0" only and the flow stops at state S3. The steps required for programming are described together with FIG. 7.

If an erase of the double bit DB is necessary to reach the final state, the flow continues with action A2. However, if only one of the bits of the double bit is to be erased, then a reprogramming of the other bit of the double bit is necessary as both bits of the double bit are erased. For this purpose, the address or state of the bit which is not to be erased is stored in a register in action A2. In action A3, the double bit DB is erased by applying the potentials to the respective bitlines and wordline as shown in FIG. 6.

The flow then moves on to query Q3 in which it is determined if a reprogramming of one of the bits of the double bit is necessary. For all the transitions ending in final states with (1, 1), no such programming is necessary. These are the transitions (0, 0)→(1, 1), (0, 1)→(1, 1), and (1, 0)→(1, 1). The method exits at state S4 for these transitions.

In case a reprogramming of one of the bits is necessary, the flow moves to action A4 in which the address or state of the bit, which is not to be erased, is recovered. Action A5 then consists of reprogramming the bit of the double bit DB that was not to be erased in action A3 or to program the bit of the double bit DB that is to change from an erase state to a program state. The potentials required for programming the individual bits are described together with FIG. 7. State S5 is the end of the method for the transitions (0, 0)→(0, 1), (0, 0)→(1, 0), (0, 1)→(1, 0), and (1, 0)→(0, 1) in which the intermediate state (1, 1) has been passed.

It is clear that variations in the flow chart are possible such as not storing the address or state in action A2 and not recovering the address in action A4 if the steps can be eliminated or performed in a different manner or moment.

Figure 9:
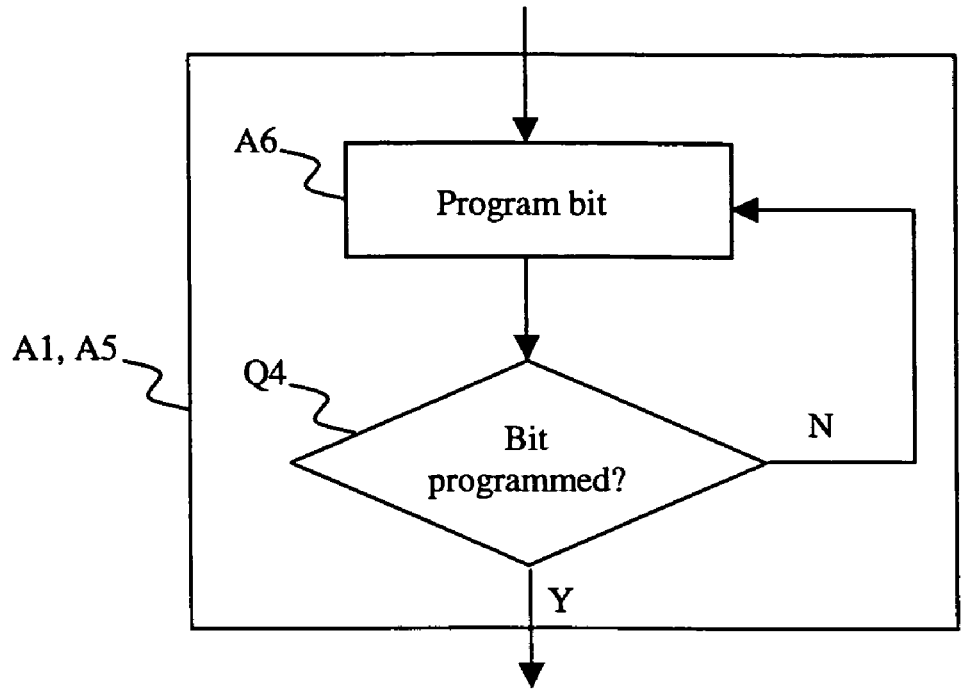
FIG. 9 shows a flow chart for an extended erasing step.

FIG. 9 shows a variation of action A1 and A5 in which bits of the double bit are programmed. Action A6 is the program action while query Q4 tests if the bit that has to be programmed has been programmed. If this is true, then the flow continues. Otherwise, the step of programming the bit is repeated until the desired final value is reached. It is an advantage if only the bit that is to be programmed in the final state is tested in order to save time. The program verify operation determines that the programmed voltage threshold range is above a minimum voltage level by applying the minimum voltage to the gate contacts of the memory cells. If the memory cells remain non-conductive, the program operation was successful.

Figure 10:
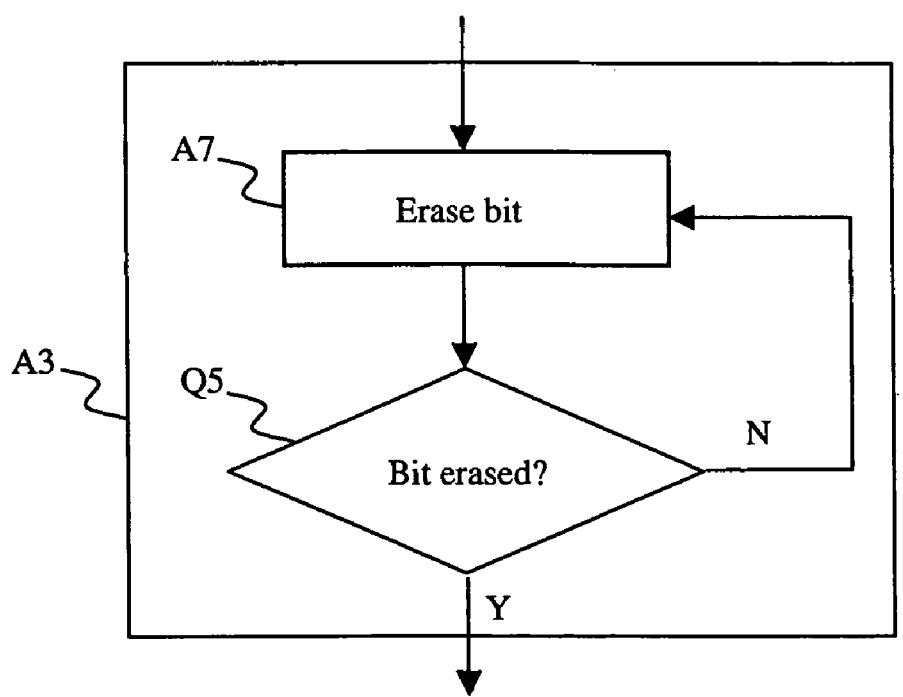
FIG. 10 shows a flow chart for an extended programming step.

Similarly, FIG. 10 shows a variation of the erase action A3. Action A7 erases the double bit DB and in the query Q5, it is tested if the bit that is to be erased is truly erased. If this is the case, then the flow moves on. If not, the erase operation is repeated. It is an advantage if only the bit that is to be erased in the final state is tested in order to save time. The erase verify operation determines that the erased voltage threshold range is below a maximum voltage level by applying the maximum voltage to the gate contacts G of the memory cells. If all the memory cells turn on, the erase was successful.

Figures 11, 12, 13:
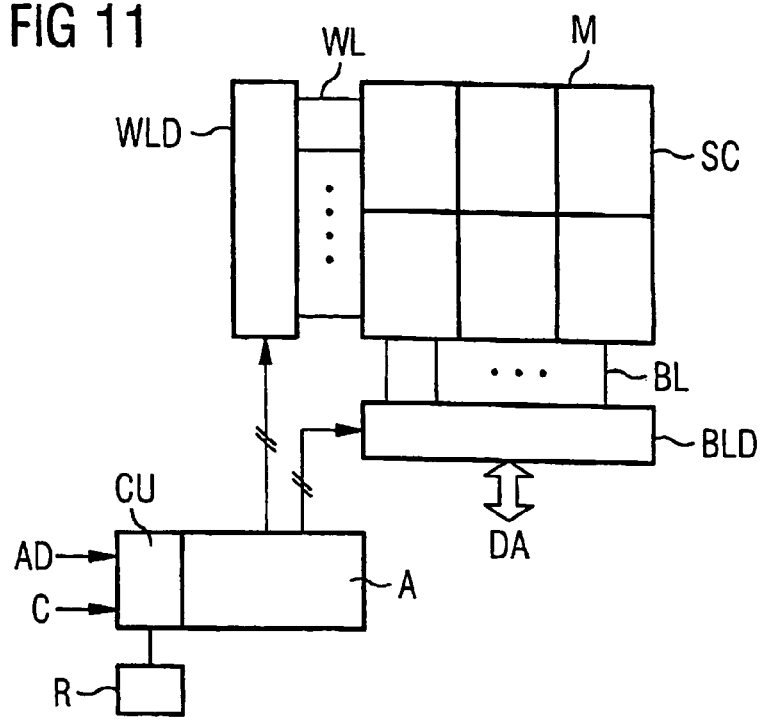
FIG. 11 shows a memory with a control unit for switching between the conventional method and the method according to the invention.
FIG. 12 shows a table of operations necessary for writing data according to a conventional method.
FIG. 13 shows a table of operations necessary for writing data according to a method of the invention.

FIG. 11 shows a block diagram of a semiconductor memory. A memory array M comprising sectors SC, which are also known as segments or blocks, is connected to wordlines WL and bitlines BL. A bitline decoder BLD and a wordline decoder WLD are used for selecting memory cells (not shown) for read, erase and programming operations. Data DA can be input and output through the bitline decoder BLD. An address AD is decoded in the address unit A. Memories like this are known from prior art.

According to an embodiment of the invention, a control unit CU and a register R are added to the address unit A. The control unit CU receives a memory programming command C and an address AD as inputs. By means of the control unit CU, the memory programming mode can be switched between a mode in which all memory cells in a sector SC are erased and then programmed, as is common in the state of the art, or a second mode in which memory cells can be programmed with a double bit granularity as described above. The control unit CU switches between the two modes depending on the command C received. If, according to the command C, a block of data large with respect to the size of the sector SC is to be programmed, then the operation mode known from the state of art is selected. If only a small number of bits are to be programmed, then the programming method according to an embodiment of the invention is used.

In case that the command C does not specify the amount of data to be written, the control unit CU compares the data to be written into the memory M with the data already stored in the memory M. To do so, the control unit CU determines how many bits would need to be erased in each sector and the bits of the bits across the sectors. Depending on this information the control unit CU decides if it is more efficient to erase a whole sector or to erase double bits. Besides the number of programming and erase cycles, the criteria for efficiency may also depend on other factors such as power consumption and required programming speed.

The register R is used for storing values such as the address or initial states of the bits that are not to be erased in the double bit programming mode.

FIGS. 12 and 13 show a comparison of the operations needed for writing data using a method according to prior art and according to the invention, respectively. The letter "E" is used for indicating an erasure of the double bit, the letter "P" is used for indicating programming one of the bits and a "/" is used to indicate that no operation is performed.

FIG. 12 shows all 16 possible transitions of initial states IS to final states FS in a prior art memory. It can be seen that the double bit is erased in all 16 possible transitions. The bits are then programmed individually so as to reach the desired final state. As all the final states in a column are the same, all the actions in each column are the same. Given an equal probability of all 16 possible transitions, a total of 16 erase operations "E" and 16 programming operations "P" are needed on average.

FIG. 13 illustrates the operations required according to an embodiment of the invention. An erase operation "E" is only performed when a bit in the double bit has to change from a "0" to a "1" state. If the initial state and the final state are equal, no operations are performed at all. In cases where no erase is needed, only the bit to be programmed is programmed. If the final state can be reached after erasing only, no further programming is done. Reprogramming after an erase is only done if the final state has not been reached.

In contrast to prior art, on average, only 10 programming operations "P" are needed instead of 16 and the number of erase operations "E" has been reduced from 16 to only 7. Assuming that the erase and programming times are proportionate to the number of double bits to be erased and to the number of bits to be programmed, the power consumption will be improved in the same proportions. Also, as less erasing and programming steps are performed, the memory will be faster while at the same time the number of cycles that each memory cell undergoes is reduced. In this way, the reliability of the memory and thus its lifetime can be increased.

The advantages of the invention become even more apparent if one considers that in known flash memories each erase cycle actually consists of three separate steps. In a first step, which is performed before the actual erasing step, memory cells are pre-programmed to ensure that all memory cells possess about the same threshold values. This is done in order to reduce the likelihood of memory cells being over-erased or depleted in the second step, in which the memory cells are erased. In a third step, which is performed after the erasing step and is called soft-programming, the erased memory cells are programmed with lower than normal programming voltages in order to ensure that the memory cells have about the same threshold values. The invention can be applied in each of the three steps so that the effect of its advantages is multiplied.

It will be apparent to those skilled in the art that various modifications and variations can be made of the memory presented and of the methods of operating such memory without departing from the scope or the spirit of the invention. In view of the foregoing, it is intended that the present invention covers modifications and variations of this invention provided they fall within in the scope of the following claims and their equivalents.

What is claimed is:

1. A method for writing data into a non-volatile semiconductor memory that includes a first bit and a second bit that are erased simultaneously, wherein initial states stored in the first bit and in the second bit are changed to final states by executing one step in a group of steps a), b), c) and d), wherein the method comprises:
- a) if the final states of both the first bit and the second bit coincide with their respective initial states, maintaining the initial states of the first bit and the second bit;
- b) if both the first bit and the second bit have erased final states and the initial states of either the first bit or the second bit is not erased, erasing both the first bit and the second bit;
- c) if neither the first bit nor the second bit is to be changed from a programmed initial state to an erased final state, programming the first bit if the first bit is to be changed from an erased initial state to a programmed final state and/or programming the second bit if the second bit is to be changed from an erased initial state to a programmed final state; and
- d) if only one of the first bit and the second bit is to be changed from a programmed initial state to an erased final state, first erasing both the first bit and the second bit and then programming the first bit if the first bit is programmed in the final state or programming the second bit if the second bit is programmed in the final state.

2. The method according to claim 1, wherein in steps b) and d) the first bit and the second bit are erased selectively with respect to all the other bits stored in the semiconductor memory.

3. The method according to claim 1, wherein the semiconductor memory comprises:
- a plurality of memory cells;
- a plurality of bitlines; and
- a plurality of wordlines;

wherein
- each memory cell includes a gate contact, a first source/drain contact and a second source/drain contact and provides storage for a first bit and a second bit, which each are in a programmed state or an erased state;
- the plurality of memory cells are organized in rows along a first direction and in columns along a second direction;
- in each row, the gate contacts of the memory cells are coupled to a respective same wordline of the plurality of wordlines;
- in each row, each memory cell is coupled to a neighboring memory cell via a respective one of its source/drain contacts;
- in each column, the source/drain contacts of each memory cell are coupled to a respective same bitline of the plurality of bitlines;
- a first memory cell and a second memory cell are memory cells that are adjacent to each other along rows such that a first source/drain of the first memory cell is coupled to a first source/drain of the second memory cell and such that the gate contact of the first memory cell is coupled to the gate contact of the second memory cell by one of the wordlines; and
- the first bit is stored in the first memory cell adjacent the first source/drain and the second bit is stored in the second memory cell adjacent the second source/drain.

4. The method according to claim 3, wherein the memory cells comprise nitride programmable read only memory cells.

5. The method according to claim 3, wherein in steps b) and d) the first bit and the second bit are erased selectively with respect to all the other bits stored in the semiconductor memory.

6. The method according to claim 5, wherein selectively erasing both the first bit and the second bit comprises:
- applying a wordline potential to the wordline that couples the gate contact of the first memory cell and the gate contact of the second memory cell;
- applying a second bitline potential that is higher than the wordline potential to the bitline that couples the first source/drain contact of the first memory cell and the first source/drain contact of the second memory cell; and
- letting the potential of the bitline that couples a second source/drain contact of the first memory cell and the potential of the bitline that connects a second source/drain contact of the second memory cell float.

7. The method according to claim 6, wherein erasing both the first bit and the second bit in steps b) and d) comprises:
- i) erasing both the first bit and the second bit;
- ii) testing if both the first bit and the second bit are erased; and
- iii) if necessary, repeating steps i) and ii) until both the first bit and the second bit are erased.

8. The method according to claim 3, wherein programming the first bit and/or the second bit in steps c) and d) comprises:
- applying a wordline potential to the wordline that couples the gate contact of the first memory cell and the gate contact of the second memory cell;
- applying a second bitline potential that is lower than the wordline potential to the bitline that couples the first source/drain of the first memory cell and the first source/drain of the second memory cell;
- applying a third bitline potential that is lower that the second bitline potential to the bitline that is coupled to a second source/drain of the second memory cell and letting the potential of the bitline that is coupled to a second source/drain of the first memory cell float, if the second bit is to be programmed in the final state; and
- applying a first bitline potential that is lower than the second bitline potential to the bitline coupled to the second source/drain contact of the first memory cell and letting the potential of the bitline that is coupled to the second source/drain of the second memory cell float, if the first bit is to be programmed in the final state.

9. The method according to claim 8, wherein programming the first bit and/or the second bit comprises:
- i) programming the first bit and/or the second bit;
- ii) after programming, testing if the desired programmed final state is stored in the first bit and/or the second bit; and
- iii) if necessary, repeating steps i) and ii) until the desired final programmed state is stored in the first bit and the second bit.

10. The method according to claim 3, wherein the memory cells are grouped into sectors, each sector containing a predetermined number of memory cells, wherein writing data into the memory cells of a sector comprises:
- erasing all memory cells in that sector and then programming required memory cells if the number of bits of data to be written into the semiconductor memory exceeds a predetermined fraction of the predetermined number of memory cells in a sector; and
- omitting the execution of steps a) to d).

11. The method according to claim 1, wherein step d) further comprises:

storing the initial states of at least one of the first bit or the second bit before erasing the first bit and the second bit; and using the stored values for programming either one of the first bit or the second bit to their respective initial value.

12. The method according to claim 1, further comprising determining a number of bits of data to be written into the semiconductor memory before executing any of steps a), b), c) or d).

13. The method according to claim 1, wherein the memory cells comprise nitride programmable read only memory cells.

14. A method for writing data into a non-volatile semiconductor memory, wherein the semiconductor memory comprises a plurality of memory cells, each memory cell providing storage for a first bit and a second bit, each of the first bit and the second bit being able to store a programmed or erased state, wherein first memory cells and corresponding second memory cells of the plurality of memory cells are coupled by a same bitline and a same wordline, wherein the initial states stored in the first bit of a second memory cell and in the second bit of a corresponding first memory cell are changed to final states by executing one step in the group of steps a), b), c), d) and e), wherein:

step a) is executed if a number of bits to be changed exceeds a predetermined number and if the final states of both the first bit and the second bit coincide with their respective initial states and comprises maintaining the initial states of the first bit and the second bit;

step b) is executed if the number of bits to be changed exceeds the predetermined number and if both the first bit and the second bit have erased final states and the initial states of both the first bit and the second bit were not erased and comprises erasing both the first bit and the second bit;

step c) is executed if the number of bits to be changed exceeds the predetermined number and if neither the first bit nor the second bit is to be changed from a programmed initial state to an erased final state and comprises programming the first bit if the first bit is to be changed from an erased initial state to a programmed final state, and programming the second bit if the second bit is to be changed from an erased initial state to a programmed final state;

step d) is executed if the number of bits to be changed exceeds the predetermined number and if only one of the first bit and the second bit is to be changed from a programmed initial state to an erased final state and comprises first erasing both the first bit and the second bit and then programming the first bit if the first bit is programmed in the final state or programming the second bit if the second bit is programmed in the final state; and step e) is executed if the number of bits to be changed does not exceed the predetermined number and comprises erasing all memory cells in a sector and then programming required memory cells.

15. The method according to claim 14, wherein in steps b) and d) the first bit and the second bit are erased selectively with respect to all the other bits stored in the semiconductor memory.

16. The method according to claim 14, wherein the memory cells comprise nitride programmable read only memory cells.

17. A non-volatile semiconductor memory, comprising:
a plurality of wordlines;
a plurality of bitlines;
a plurality of memory cells grouped in sectors and coupled to the plurality of wordlines and the plurality of bitlines to form a virtual ground array, wherein each memory cell stores a first bit and a second bit;
an address unit;
a wordline decoder coupled to the address unit;
a bitline decoder coupled to the address unit;
a control unit coupled to the address unit, the control unit causing the address unit to switch between addressing whole sectors of memory cells, and addressing the first bits of second memory cells and the second bits of first memory cells, wherein the first memory cells and the second memory cells are coupled by a same wordline and a same bitline.

18. The semiconductor memory according to claim 17, wherein the control unit causes the address unit to switch between addressing whole sectors and addressing first bits and second bits depending on a number of bits of data to be written into the memory.

19. The semiconductor memory according to claim 17, wherein the control unit causes the address unit to switch between addressing whole sectors and addressing first bits and second bits depending on a command used for writing data into the memory.

20. The semiconductor memory according to claim 17, wherein the memory cells comprise nitride programmable read only memory cells.

* * * * *